(12) United States Patent
Morse et al.

(10) Patent No.: US 8,338,857 B2
(45) Date of Patent: Dec. 25, 2012

(54) GERMANIUM/SILICON AVALANCHE PHOTODETECTOR WITH SEPARATE ABSORPTION AND MULTIPLICATION REGIONS

(75) Inventors: Michael T. Morse, San Jose, CA (US); Olufemi I. Dosunmu, Santa Clara, CA (US); Ansheng Liu, Cupertino, CA (US); Mario J. Paniccia, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/870,811

(22) Filed: Aug. 28, 2010

(65) Prior Publication Data

US 2010/0320502 A1   Dec. 23, 2010

Related U.S. Application Data

(63) Continuation of application No. 11/170,556, filed on Jun. 28, 2005, now Pat. No. 7,233,051, and a continuation of application No. 11/724,805, filed on Mar. 15, 2007.

(51) Int. Cl.
*H01L 31/028* (2006.01)
*H01L 31/0352* (2006.01)

(52) U.S. Cl. . 257/186; 257/438; 257/440; 257/E31.011; 257/E31.032

(58) Field of Classification Search .............. 257/432, 257/436, 438, 443, E31.005, E31.011, E31.012, 257/E31.023, E31.024, E31.035, E31.06, 257/E27.134, E27.135, E27.142, 183, 183.1, 257/184, 185, 186, 187, 188, 189, 431, 440, 257/E31.001, E31.002, E31.003, E31.032, 257/E31.033, E31.052, E31.053, E31.054, 257/E31.055, E31.063, E31.116
See application file for complete search history.

(56) References Cited

U.S. PATENT DOCUMENTS

| 3,324,297 | A | 6/1967 | Stieltjes et al. |
| 4,009,058 | A | 2/1977 | Mills |
| 4,210,923 | A | 7/1980 | North et al. |
| 4,212,019 | A | 7/1980 | Wataze et al. |
| 4,786,573 | A | 11/1988 | Amada et al. |

(Continued)

FOREIGN PATENT DOCUMENTS

CN    1327272 A    12/2001

(Continued)

OTHER PUBLICATIONS

Shi et al. "Design and Analysis of Separate-Absorption-Transport-Charge-Multiplication Traveling-Wave Avalance Photodetectors", Journal of Lightwave Technology, vol. 22, No. 6, p. 1583-1590, Jun. 1, 2004.*

(Continued)

*Primary Examiner* — Lynne Gurley
*Assistant Examiner* — Andrew O. Arena
(74) *Attorney, Agent, or Firm* — Blakely, Sokoloff, Taylor & Zafman LLP

(57) ABSTRACT

A semiconductor waveguide based optical receiver is disclosed. An apparatus according to aspects of the present invention includes an absorption region including a first type of semiconductor region proximate to a second type of semiconductor region. The first type of semiconductor is to absorb light in a first range of wavelengths and the second type of semiconductor to absorb light in a second range of wavelengths. A multiplication region is defined proximate to and separate from the absorption region. The multiplication region includes an intrinsic semiconductor region in which there is an electric field to multiply the electrons created in the absorption region.

3 Claims, 4 Drawing Sheets

U.S. PATENT DOCUMENTS

| | | | |
|---|---|---|---|
| 5,157,473 | A | 10/1992 | Okazaki |
| 5,233,209 | A | 8/1993 | Rodgers et al. |
| 5,280,189 | A | 1/1994 | Schuppert et al. |
| 5,401,952 | A | 3/1995 | Sugawa |
| 5,420,634 | A | 5/1995 | Matsumoto |
| 5,596,186 | A | 1/1997 | Kobayashi |
| 5,654,578 | A | 8/1997 | Watanabe |
| 5,757,057 | A | 5/1998 | Dabrowski |
| 5,897,371 | A | 4/1999 | Yeh et al. |
| 6,074,892 | A | 6/2000 | Bowers et al. |
| 6,104,047 | A | 8/2000 | Watanabe |
| 6,130,441 | A | 10/2000 | Bowers et al. |
| 6,384,462 | B1 | 5/2002 | Pauchard et al. |
| 6,459,107 | B2 | 10/2002 | Sugiyama et al. |
| 6,465,803 | B1 | 10/2002 | Bowers et al. |
| 6,492,239 | B2 | 12/2002 | Yang et al. |
| 6,515,315 | B1 | 2/2003 | Itzler et al. |
| 6,632,028 | B1 | 10/2003 | Yang et al. |
| 6,635,908 | B2 | 10/2003 | Tanaka et al. |
| 6,693,308 | B2 | 2/2004 | Sankin et al. |
| 6,759,675 | B2 | 7/2004 | Csutak et al. |
| 6,797,581 | B2 | 9/2004 | Vickers |
| 6,831,265 | B2 | 12/2004 | Yoneda et al. |
| 6,858,463 | B2 | 2/2005 | Bond |
| 6,858,912 | B2 | 2/2005 | Marshall et al. |
| 6,963,089 | B2 | 11/2005 | Shi et al. |
| 7,072,557 | B2 | 7/2006 | Nagarajan et al. |
| 7,082,248 | B1 | 7/2006 | Morse |
| 7,122,734 | B2 | 10/2006 | Fetzer et al. |
| 7,160,753 | B2 | 1/2007 | Williams, Jr. |
| 7,271,405 | B2 | 9/2007 | Krishna et al. |
| 7,348,608 | B2 | 3/2008 | Ko et al. |
| 2004/0079408 | A1 | 4/2004 | Fetzer et al. |
| 2005/0006678 | A1 | 1/2005 | Tanaka et al. |

FOREIGN PATENT DOCUMENTS

| | | |
|---|---|---|
| EP | 0709901 A1 | 5/1996 |
| GB | 2025693 A | 1/1980 |
| GB | 2054957 A | 2/1981 |
| JP | 61-226976 A | 10/1986 |
| JP | 61226973 | 10/1986 |
| JP | 4-93088 | 3/1992 |
| JP | 04-093088 A | 3/1992 |
| JP | 7202254 | 8/1995 |
| JP | 2001-284630 | 10/2001 |
| JP | 2003-163361 | 6/2003 |
| KR | 10-0206079 B1 | 7/1999 |
| WO | 2004/027879 A2 | 4/2004 |
| WO | WO-2004027879 | 4/2004 |
| WO | 2007/002953 A2 | 1/2007 |
| WO | 2007/002953 A3 | 6/2007 |

OTHER PUBLICATIONS

Office Action for U.S. Appl. No. 11/121,511, mailed on Jul. 6, 2006.
Chinese Office Action for Chinese Patent Application No. 200610151347.1, mailed on Jul. 17, 2009.
Korean Office Action for Korean Patent Application No. 10-2007-7030930, mailed on May 28, 2009.
Office Action for U.S. Appl. No. 11/490,994, mailed on Sep. 16, 2009.
Office Action for U.S. Appl. No. 11/488,311, mailed on Jun. 17, 2009.
Office Action for U.S. Appl. No. 11/488,311, mailed on Oct. 29, 2009.
Search Report for UK Patent Application No. 091747.6 mailed Sep. 30, 2010, 3 pgs.
Final Notice of Rejection for Japanese Patent Application No. 2008-518526 mailed Feb. 28, 2012, 4 pages (with English Translation).
Decision on Rejection for Chinese Patent Application No. 2006101051347.1 mailed Jan. 26, 2011, 24 pgs.
Notice of Reasons for Rejection for Japanese Patent Application No. 2008-518526 mailed Mar. 15, 2011, 2 pgs.
Green, M. A., et al., "Progress and outlook for high-efficiency crystalline silicon solar cells", Solar Energy Materials & Solar Cells 65 (2001) vol. 65, pp. 9-16.
Notice of Sixth Office Action for Chinese Patent Application No. 200610151347.1 mailed Jul. 29, 2011, 20 pages (with English Translation).
Herbert et al., "Impact Ionisation and Noise in SiGe Multiquantum Well Structures," Electronics Letters, vol. 32, No. 17, Aug. 15, 1996, pp. 1616-1618.
Nie et al., "Resonant-Cavity Separate Absorption, Charge and Multiplication Avalanche Photodiodes With High-Speed and High Gain-Bandwidth Product," IEEE Photonics Technology Letters, vol. 10, No. 3, Mar. 1998, pp. 409-411.
Herbert, D. C., "Thoery of SiGe Waveguide Avalanche Detectors Operating at .lamda.=1.3 .mu.m," IEEE Transactions on Electron Devices, vol. 45, No. 4, Apr. 1998, pp. 791-796.
Lenox et al., "Resonant-Cavity InGaAs-InAlAs Avalanche Photodiodes with Gain Bandwidth Product of 290 GHz," IEEE Photoics Technology Letters, vol. 11, No. 9, Sep. 1999, pp. 1162-1164.
Pauchard et al., "High-Performance InGaAs-on-Silicon Avalanche Photodiodes," Wednesday Afternoon, OFC 2002, pp. 345-346.
Loudon et al., "Enhancement of the Infrared Detection Efficiency of Silicon Photon-Counting Avalanche Photodiodes by Use of Silicon Germanium Absorbing Layers," Optics Letters, vol. 27, No. 4, Feb. 15, 2002, pp. 219-221.
Das et al., "On the Frequency Response of a Resonant-Cavity-Enhanced Separate Absorption, Grading, Charge, and Multiplication Avalanche Photodiode," Journal of Applied Physics, vol. 92, No. 12, Dec. 15, 2002, pp. 7133-7145.
Emsley et al., "High-Speed Resonant-Cavity-Enhances Silicon Photodetectors on Reflecting Silicon-On-Insulator Substrates," IEEE Photonics Technology Letters, vol. 14, No. 4, Apr. 2002, pp. 519-521.
Shi et al., "Design and Analysis of Separate-Absorption-Transport-Charge-Multiplication Traveling-Wave Avalanche Photodetectors," Journal of Lightwave Technology, vol. 22, No. 7, Jun. 2004, pp. 1583-1590.
Dosunmu et al., "High-Speed Resonant Cavity Enhanced Ge Photodectectors on Reflecting Si Substrates for 1550-nm Operation," IEEE Photonics Technology Letters, vol. 17, No. 1, Jan. 2005, pp. 175-177.
International Search Report for PCT Patent Application No. PCT/US2006/026214, mailed on May 4, 2007, 12 pages.
International Preliminary Report on Patentability for PCT Patent Application No. PCT/US2006/026214, mailed on Jan. 18, 2008, 8 pages.
Chinese Office Action for Chinese Patent Application No. 200610151347.1, mailed on Apr. 25, 2008.
Chinese Office Action for Chinese Patent Application No. 200610151347.1, m.ailed on Oct. 17, 2010.
Liu et al., "A Planar InP/InGaAs Avalanche Photodiode with Floating Guard Ring and Double Diffused Junction," Journal of Lightwave Technology, vol. 10, No. 2, Feb. 1992, pp. 182-193.
Hawkins et al., "High gain-bandwidth-product silicon heterointerface photodetector," Appl. Phys. Letter 70 (3), Jan. 20, 1997, pp. 303-305.
Cho et al., "Suppression of avalanche gain at the junction periphery by floating guard rings in a planar InGaAs/InGaAsP/InP avalanche photodiodes," CLEO 2000, Tuesday Afternoon, May 9, 2000, pp. 212-213.
Kang et al., "Fused InGaAs-Si Avalanche Photodiodes With Low-Noise Performances," IEEE Photonics Technology Letters, vol. 14, No. 11, Nov. 2002, pp. 1593•1595.
Lee et al., "Ion-Implanted Planar-Mesa IMPATT Diodes for Millimeter Wavelengths," IEEE Transactions on Electron Devices, vol. Ed-25, No. 6, Jun. 1978, pp. 714-722.
Temkin et al.: "Geo.6Sio.4 rib waveguide avalanche photodetectors for 1.3 pm operation," Appl. Phys. Letter 49 (13), Sep. 29, 1986, pp. 809-811.
Liu et al., "Simple, very low dark current, planar long-wavelength avalanche photodiode," Appl. Phys. Letter 53 (14), Oct. 3, 1988, pp. 1311-1313.
Mikawa et al., "Germanium Reachthrough Avalanche Photodiodes for Optical Communication Systems at 1.55-pm Wavelength Region," IEEE Transactions on Electron Devices, vol. Ed-31, No. 7, Jul. 1984, pp. 971-977.

Mikami et al., "Improved Germanium Avalanche Photodiodes," IEEE Journal of Quantum Electronics, vol. QE-16, No. 9, Sep. 1980, pp. 1002-1007.

Yoshimoto et al., "SOI Waveguide GeSi Avalanche Pin Photodetector at 1.3 pm Wavelength," IEICE Trans. Electron, vol. E81-C, No. 10, Oct. 1998, pp. 1667•1669.

Sugiyama et al., "A 1.3-um Operation Si-Based Planar P-I-N Photodiode with Ge Absorption Layer Using Strain-Relaxing Selective Epitaxial Growth Technology," Extended Abstracts of the International Conference on Solid State Devices and Materials, Japan Society of Applied Physics, Sep. 1998, pp. 384-385.

Kesan et al., "Integrated Waveguide-Photodetector Using Si/SiGe Multiple Quantum Wells for Long Wavelength Applications," Conference Article, Dec. 9, 1990, pp. 637•640.

Ru et al., "The properties of Epitaxial Pure Germanium Films on Silicon Substrate," IEEE, 2001, pp. 634-636.

Li et al., "InGaAs/InAlAs avalanche photodiode with undepleted absorber," Applied Physics Letters, vol. 82, No. 13, Mar. 31, 2003, pp. 2175-2177.

Zheng et al., "Demonstration of High-Speed Staggered Lineup GaAsSb-InP Unitraveling Carrier Photodiodes," IEEE Photonics Technology Letters, vol. 17, No. 3, Mar. 2005, pp. 651-653.

Office Action for U.S. Appl. No. 11/170,556, mailed on Oct. 6, 2006.

Office Action for U.S. Appl. No. 11/490,994, mailed on Mar. 13, 2008.

Office Action for U.S. Appl. No. 11/490,994, mailed on Sep. 15, 2008.

Office Action for U.S. Appl. No. 11/121,511, mailed on Oct. 13, 2005.

Office Action for U.S. Appl. No. 11/121,511, mailed on Feb. 1, 2006.

Office Action for U.S. Appl. No. 11/121,511, mailed on Apr. 14, 2006.

Office Action for U.S. Appl. No. 11/243,325, mailed on Nov. 23, 2005.

Office Action for U.S. Appl. No. 11/322,514, mailed on May 30, 2008.

Office Action for U.S. Appl. No. 11/322,514, mailed on Dec. 24, 2008.

Office Action for U.S. Appl. No. 11/488,311, mailed on Dec. 18, 2008.

International Search Report for PCT Patent Application No. PCT/US2007/073320, mailed on Dec. 20, 2007, 10 pages.

International Preliminary Report on Patentability for PCT Patent Application No. PCT/US2007/073320, mailed on Jan. 20, 2009.

International Search Report for PCT Patent Application No. PCT/US2007/072879, mailed on Nov. 29, 2007, 10 pages.

International Preliminary Report on Patentability for PCT Patent Application No. PCT/US2007/072879, mailed on Jan. 20, 2009.

International Search Report for PCT Patent Application No. PCT/US2006/016646, mailed on Sep. 1, 2009, 12 pages.

International Preliminary Report on Patentability for PCT Patent Application No. PCT/US2006/016646, mailed on Nov. 15, 2007, 7 pages.

Green, et al., "Progress and outlook for high-efficiency crystalline silicon solar cells", Solar Energy Materials & Solar Cells, vol. 65, 2001, pp. 9-16.

Chinese Office Action for Chinese Patent Application No. 200610077681.7, mailed on Mar. 28, 2008.

Chinese Office Action for Chinese Patent Application No. 200610077681.7, mailed on Sep. 12, 2008.

European Office Action for European Patent Application No. 06758860.8, mailed on May 2, 2008.

Chinese Office Action for Chinese Patent Application No. 200610151347.1, mailed on Apr. 3, 2009.

* cited by examiner

GERMANIUM/SILICON AVALANCHE PHOTODETECTOR WITH SEPARATE ABSORPTION AND MULTIPLICATION REGIONS

REFERENCE TO PRIOR APPLICATION

This application is a continuation of and claims priority to U.S. application Ser. No. 11/170,556 now U.S. Pat. No. 7,233,051 filed on Jun. 28, 2005 and U.S. application Ser. No. 11/724,805, filed on Mar. 15, 2007, now pending.

BACKGROUND OF THE INVENTION

1. Field of the Invention

Embodiments of invention relate generally to optical devices and, more specifically but not exclusively relate to photodetectors.

2. Background Information

The need for fast and efficient optical-based technologies is increasing as Internet data traffic growth rate is overtaking voice traffic pushing the need for fiber optical communications. Transmission of multiple optical channels over the same fiber in the dense wavelength-division multiplexing (DWDM) system provides a simple way to use the unprecedented capacity (signal bandwidth) offered by fiber optics. Commonly used optical components in the system include wavelength division multiplexed (WDM) transmitters and receivers, optical filter such as diffraction gratings, thin-film filters, fiber Bragg gratings, arrayed-waveguide gratings, optical add/drop multiplexers, lasers, optical switches and photodetectors. Photodiodes may be used as photodetectors to detect light by converting incident light into an electrical signal. An electrical circuit may be coupled to the photodetector to receive the electrical signal representing the incident light. The electrical circuit may then process the electrical signal in accordance with the desired application.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Methods and apparatuses for germanium/silicon avalanche photodetectors (APDs) with separate absorption and multiplication (SAM) regions are disclosed. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. In addition, it is appreciated that the figures provided herewith are for explanation purposes to persons ordinarily skilled in the art and that the drawings are not necessarily drawn to scale.

Figure 1A:
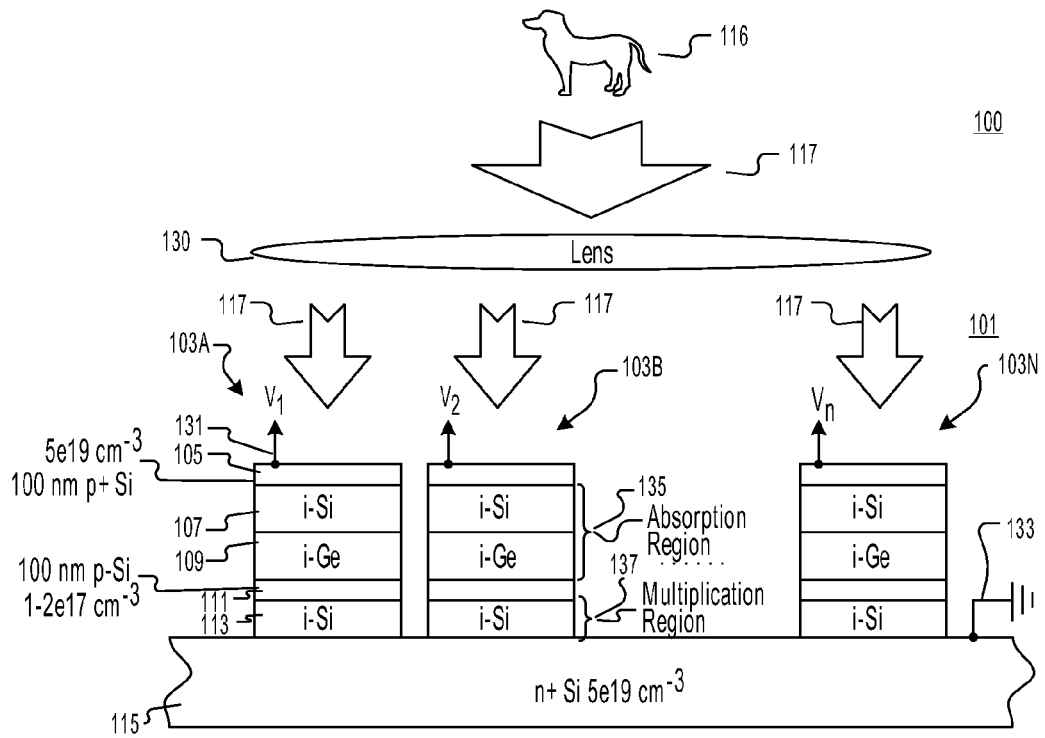
FIG. 1A is a diagram illustrating a cross-section view of a plurality of germanium/silicon avalanche photodetectors with separate absorption and multiplication regions in a system for an embodiment of the present invention.

FIG. 1A is a diagram illustrating a cross-section view of a system 100 including plurality of avalanche photodetectors 103A, 103B, . . . 103N arranged in a grid or an array 101 having one or more dimensions for an embodiment of the present invention. Illumination 117 is incident upon one or more of the plurality of avalanche photodetectors 103A, 103B, . . . 103N of the array 101. In the illustrated example, an image of an object 116 may be focused onto the array 101 through an optical element 130 with illumination 117. Thus, array 101 may function to sense images, similar to for example a complementary metal oxide semiconductor (CMOS) sensor array or the like.

Figure 1B:
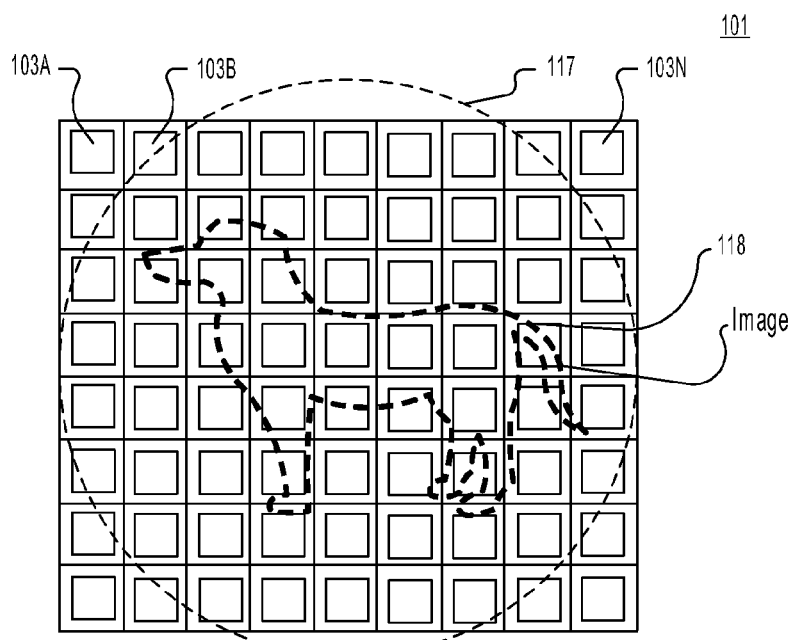
FIG. 1B is a diagram illustrating a top view of a plurality of germanium/silicon avalanche photodetectors with separate absorption and multiplication regions arranged in a two-dimensional array for an embodiment of the present invention.

To illustrate, FIG. 1B shows a top view of array 101 with the plurality of avalanche photodetectors 103A, 103B, . . . 103N arranged in a two dimensional grid such that each of the plurality of avalanche photodetectors 103A, 103B, . . . 103N function as pixels or the like for an embodiment of the present invention. The example illustrated in FIG. 1B shows an image 118 of object 116 using the pixels of array 101 within illumination 117.

It is noted that although FIGS. 1A and 1B illustrate an example application of the avalanche photodetectors being employed in a imaging system for explanation purposes, the avalanche photodetectors may be employed in other types of applications in which for example the detection of light having any of a variety of wavelengths including visible through infrared wavelengths is realized in accordance with the teachings of the presenting invention.

Referring back to FIG. 1A, optical element 131 may be a lens or other type of refractive or diffractive optical element such that the image is focused on array 101 with illumination 117. Illumination 117 may include visible light, infrared light and/or a combination of wavelengths across the visible through infrared spectrum for an embodiment of the present invention.

In the example illustrated in FIG. 1A, each of the plurality of avalanche photodetectors 103A, 103B, . . . 103N includes semiconductor material layers, 105, 107, 109, 111, 113 and 115. A contact 131 is coupled to layer 105 and a contact 133 is coupled to layer 115. For one embodiment, layer 105 is a p+doped layer of silicon having a doping concentration of for example 5e19 cm$^{-3}$ and a thickness of for example 100 nanometers. For one embodiment, layer 105 has a doping concentration that provides an improved electrical coupling between a contact 131 and layer 105. For one embodiment, layers 107 and 109 are intrinsic semiconductor material regions that form an absorption region 135 of the avalanche photodetector 103A. Layer 107 is a layer of intrinsic silicon and layer 109 is a layer of intrinsic germanium for one embodiment. Proximate to the absorption region 135 is a separate multiplication region 137, which includes a layer 113 of intrinsic semiconductor material such as silicon. As shown in the illustrated example, layer 113 is disposed between a layer 111 of p−doped silicon and a layer 115 of n+doped silicon. For one embodiment, layer 111 has a thickness of for example 100 nanometers and a doping concentration of for example 1-2e17 cm$^{-3}$. For one embodiment, layer 115 has a doping concentration of for example 5e19 cm$^{-3}$. In the illustrated example, each of the plurality of avalanche photodetectors 103A, 103B, . . . 103N is coupled between ground and a voltage $V_1, V_2, \ldots V_n$ such that each avalanche photodetector is biased resulting in an electric field between layers 105 and 115 as shown.

It is appreciated of course that the specific example doping concentrations, thicknesses and materials or the like that are described in this disclosure are provided for explanation purposes and that other doping concentrations, thicknesses and materials or the like may also be utilized in accordance with the teachings of the present invention.

In operation, illumination 117 is incident upon layer 105 of one or more of each of the plurality of avalanche photodetectors 103A, 103B, . . . 103N. Layer 105 is relatively thin such that substantially all of illumination 117 is propagated through layer 105 to layer 107 of the absorption region 135. For one embodiment, the intrinsic silicon of layer 107 absorbs the light having wavelengths in the range of approximately 420 nanometers to approximately ~1100 nanometers. Most of the light having wavelengths greater than approximately ~1100 nanometers is propagated through the intrinsic silicon layer 107 into the intrinsic germanium layer 109 of the absorption region 135. The intrinsic germanium of layer 109 absorbs that remaining light that propagates through layer 107 up to wavelengths of approximately 1600 nanometers.

Figure 2:
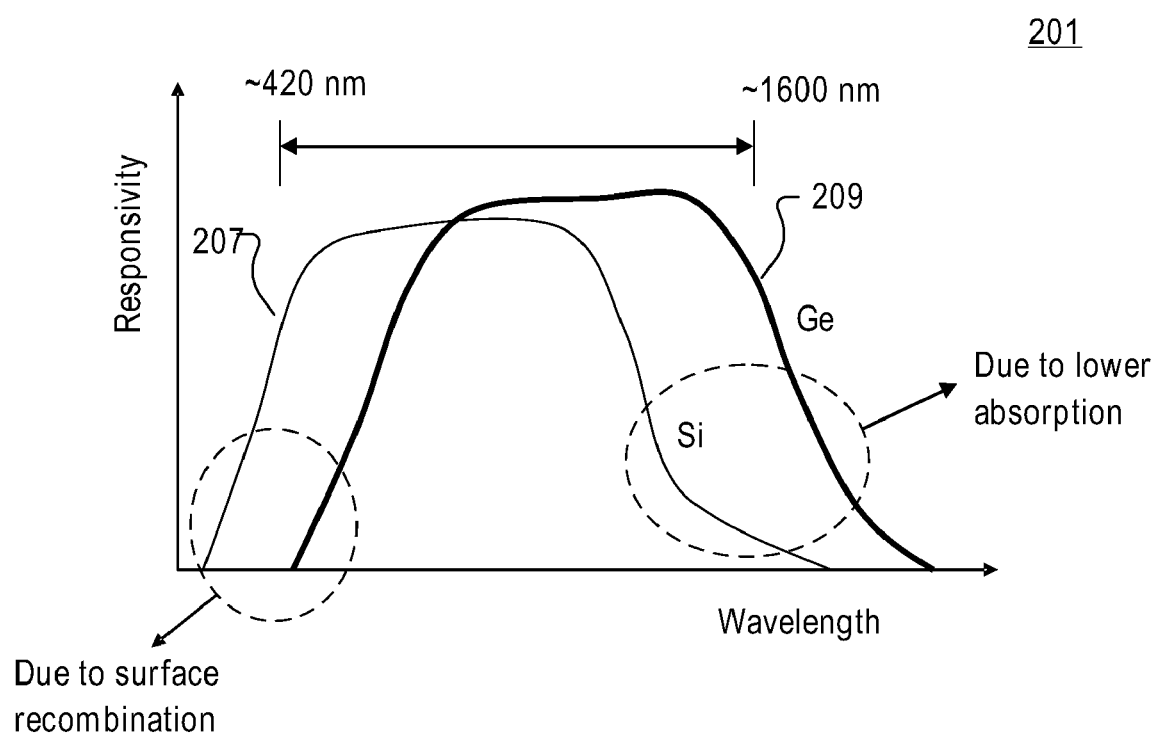
FIG. 2 is a diagram illustrating responsivity versus wavelength relationships with respect to the silicon and germanium layers of an absorption region of an avalanche photodetector for an embodiment of the present invention.

To illustrate, FIG. 2 is a diagram 201 that shows example responsivity versus wavelength relationships of silicon and germanium for an embodiment of the present invention. In particular, diagram 201 shows plot 207, which shows the responsivity of silicon with respect to wavelength, and plot 209, which shows the responsivity of germanium with respect to wavelength. For one embodiment, plot 207 may correspond to the responsivity of the intrinsic silicon of layer 107 and plot 209 may correspond to the responsivity of the intrinsic germanium of FIG. 1A. As shown in plot 207, the silicon absorbs light having wavelengths as short as approximately 420 nanometers. As the wavelengths get longer, the responsivity of silicon begins to drop off due to the lower absorption of silicon at infrared wavelengths. Indeed, as the wavelength of light increases at this point, the silicon becomes increasingly transparent as the light becomes more infrared. Thus, with respect to FIG. 1A, the longer wavelengths of illumination 117 are not absorbed in layer 107 and are instead propagate through to layer 109. However, plot 209 shows that the germanium absorbs the longer wavelength light in layer 109 that is propagated through layer 107 up to wavelengths of approximately 1600 nanometers for an embodiment of the present invention. The silicon in layer 107 absorbs the shorter wavelengths of light less than approximately ~1000 nanometers, while at the same wavelength range the germanium has a much larger absorption coefficient and would otherwise not generate significant photocurrent due to surface recombination in accordance with the teachings of the present invention.

Therefore, referring back to FIG. 1A, with the combination of the intrinsic silicon of layer 107 and the intrinsic germanium of layer 109 in absorption region 135, illumination 117 is absorbed in the absorption regions 135 of the avalanche photodetectors from visible light having a wavelength of approximately 420 nanometers all the way up to longer infrared wavelengths having wavelengths up to approximately 1600 nanometers in accordance with the teachings of the present invention. This absorption of the light of illumination 117 in semiconductor layers 107 and 109 results in the generation of photocarriers or electron-hole pairs in the absorption region 135.

Due to the biasing and electric fields present in the avalanche photodetector, the holes of the electron-hole pairs generated in the absorption region 135 drift towards layer 105 and the electrons drift towards layer 115. As the electrons drift into the multiplication region 137, the electrons are subjected to a relatively high electric field in intrinsic silicon layer 113 resulting from the doping levels of the neighboring layers of p−doped silicon in layer 111 and n+doped silicon in layer 115. As a result of the high electric field in layer 113, impact ionization occurs to the electrons that drift into the multiplication region 137 from the absorption region 135 in accordance with the teachings of the present invention. Therefore, the photocurrent created from the absorption of illumination 117 in absorption region 135 is multiplied or amplified in multiplication region 137 for an embodiment of the present invention. The photocarriers are then collected at contacts 131 and 133. For instance holes may be collected at contact 131 and electrons are collected at contact 133. Contacts 131 and 133 may be coupled to electrical circuitry to process the signals present at each of the contacts 131 and 133 according to embodiments of the present invention.

Figure 3:
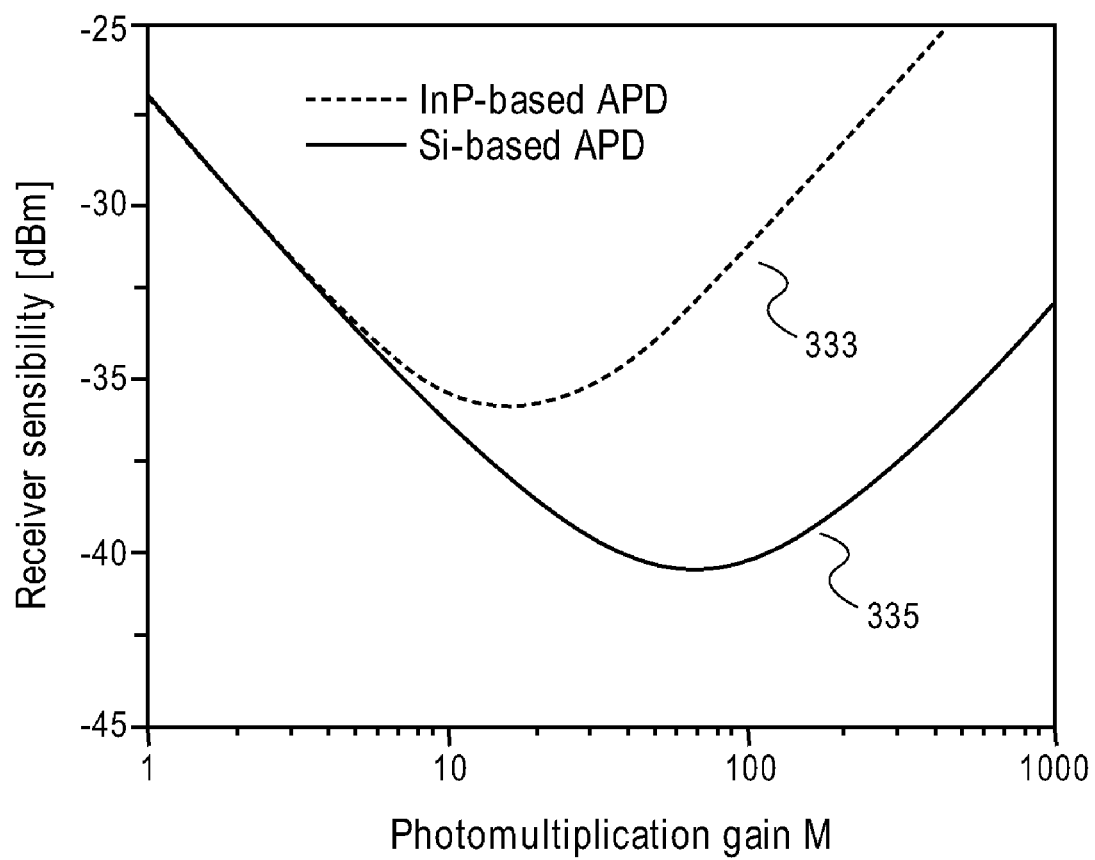
FIG. 3 is a diagram illustrating an improvement in sensitivity with the use of silicon in the multiplication region of a germanium/silicon avalanche photodetector with separate absorption and multiplication regions for an embodiment of the present invention.

As mentioned above, multiplication region 137 includes intrinsic silicon in layer 113 as will as silicon in neighboring p−doped and n+doped layers 111 and 115, respectively. FIG. 3 is a diagram 301 illustrating an improvement in sensitivity that is realized for an embodiment of an avalanche photodetector utilizing silicon in the multiplication region 137 instead of another material, such as for example indium phosphide (InP). In particular, diagram 301 shows a relationship between a receiver sensitivity dBm versus photomultiplication gain M for various embodiments of an avalanche photodectector. In particular, plot 333 shows a receiver sensitivity versus photomultiplication gain relationship for an indium phosphide based avalanche photodetector while plot 335 shows a receiver sensitivity versus photomultiplication gain relationship for silicon based avalanche photodetector. As can be observed in FIG. 3 by comparing plots 333 and 335, receiver sensitivity is improved by approximately 4-5 dB by using a silicon based avalanched photodetector instead of an indium phosphide based avalanche photodetector for an embodiment of the present invention. This shows that less power is therefore needed using silicon instead of indium phosphide in multiplication region 137 to accurately detect a signal encoded in an optical signal received by an avalanche photodetector for an embodiment of the present invention.

The utilization of silicon in the multiplication region 137 for an embodiment of the present invention improves sensitivity of the avalanche photodetectors 103A, 103B, . . . 103N as shown in FIGS. 1A and 1B because of the impact ionization properties of the electrons and holes in the material. For an embodiment of the present invention, substantially only one type of carrier, in particular electrons, are able to achieve impact ionization because of the use of silicon in multiplication region 137. This can be seen quantitatively with the k-factor, which is the ratio of impact ionization coefficients of holes to electrons. Silicon has a k-factor about one order of magnitude lower than, for example, indium phosphide. A result of the use of silicon is that substantially only electrons are selectively multiplied or amplified in multiplication region 137 instead of holes. Thus, noise and instability in the avalanche photodetectors 103A, 103B, . . . 103N is reduced for an embodiment of the present invention compared to a material with a higher k-factor. An equation showing the excess noise tied to the k-factor (k) is:

$$F_A(M)=kM+(1-k)(2-(1/M))$$ (Equation 1)

where $F_A$ is the excess noise factor and M is the gain of the avalanche photodetector.

The chances of runaway resulting from the generation more than one type of carrier in multiplication region 137 is substantially reduced because substantially only electrons are able to achieve impact ionization by using silicon of multiplication region 137 for an embodiment of the present invention. To illustrate, the k-factor value of silicon for an embodiment of the present invention is less than 0.05 or approximately 0.02-0.05. In comparison, the k-factor value for other materials such as for example indium gallium arsenide (InGaAs) is approximately 0.5-0.7 while the k-factor value for germanium is approximately 0.7-1.0. Thus, the k-factor value using silicon for an embodiment of the present invention is less than other materials. Therefore, using silicon for an embodiment of an avalanche photodetector in multiplication region 137 results in improved sensitivity over avalanche photodetectors using other materials such as indium gallium arsenide or germanium or the like.

Figure 4A:
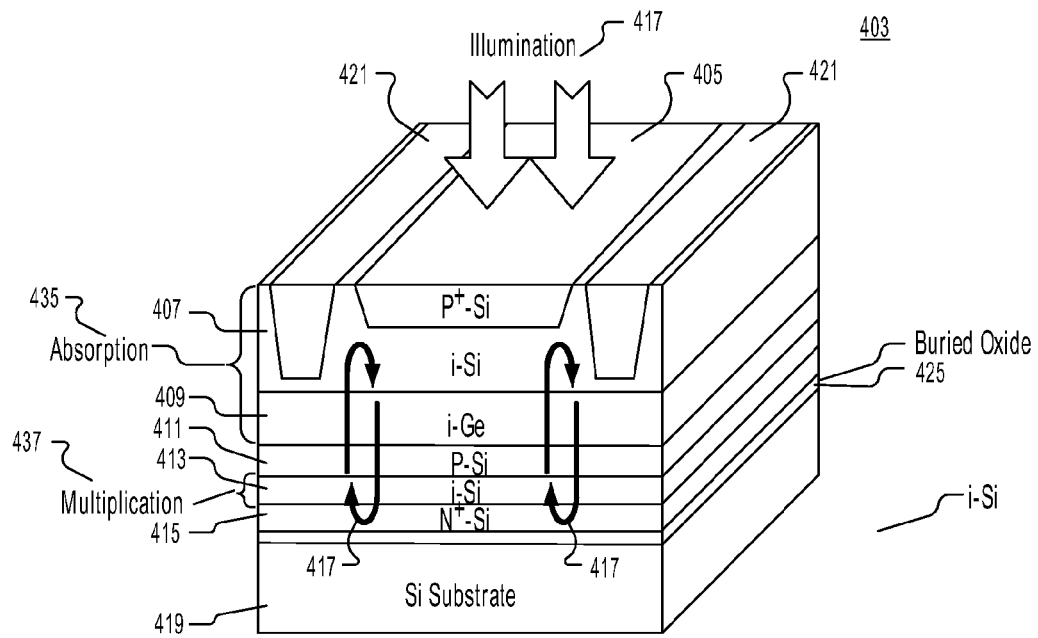
FIG. 4A is a diagram illustrating a cross-section view of a germanium/silicon avalanche photodetector with a resonant cavity for an embodiment of the present invention.

FIG. 4A is a diagram illustrating a cross-section view of a germanium/silicon avalanche photodetector 403 with a resonant cavity for an embodiment of the present invention. It is appreciated that avalanche photodetector 403 shares similarities with the examples avalanche photodetectors 103A, 103B, . . . 103N shown in FIGS. 1A and 1B and that avalanche photodetector 403 may be used in place of any one or more of the avalanche photodetectors 103A, 103B, . . . 103N in accordance with the teachings of the present invention. Referring back to the example shown in FIG. 4A, avalanche photodetector 403 includes layers, 405, 407, 409, 411, 413 and 415. In the example illustrated in FIG. 4A, avalanche photodetector 403 is disposed on a silicon-on-insulator (SOI) wafer, and therefore, avalanche photodetector also includes a silicon substrate layer 419 and a reflective layer, which is illustrated in FIG. 4A as a buried oxide layer 425. For one embodiment, avalanche photodetector 403 also includes guard rings 421, which are disposed at the surface and into layer 407 on opposing sides of layer 405 at the surface of layer 407 as shown in FIG. 4A.

For one embodiment, layer 405 and guard rings 421 are p+doped silicon having a doping concentration that provides an improved electrical coupling between a contact coupled to layer 405 and layer 407. For one embodiment, guard rings 421 are disposed proximate to layer 405 as shown in FIG. 4A to help prevent or reduce electric field from extending to or past the edges of avalanche photodetector 403. By helping to isolate or confine the electric field within the structure of avalanche photodetector 403, guard rings 431 help to reduce leakage current from the avalanche photodetector 403 structure in accordance with the teachings of the present invention.

For one embodiment, layers 407 and 409 form an absorption region 435 of the avalanche photodetector 403. Layer 407 is a layer of intrinsic silicon and layer 409 is a layer of intrinsic germanium for one embodiment. Proximate to the absorption region 435 is a separate multiplication region 437, which includes a layer 413 of intrinsic silicon. As shown in the depicted example, layer 413 is disposed between a layer 411 of p–doped silicon and a layer 415 of n+doped silicon. For one embodiment, layers 411 and 415 having doping concentrations that result in a high electric field in layer 413 of multiplication region 437. For example, layer 411 has doping concentration of for example 1-2e17 $cm^{-3}$ and layer 415 has a doping concentration of for example 5e19 $cm^{-3}$ for one embodiment. In addition, a lower electric field is also present between layer 405 and layer 415 for an embodiment of the present invention.

In operation, as shown in FIG. 4A, illumination 417 is directed to avalanche photodetector 403 and is incident upon a surface of avalanche photodetector 403. In the example illustrated in FIG. 4A, illumination 417 is directed through free space and is incident upon a surface of layer 405. The light from illumination 417 is absorbed in absorption region 435 and electrons from the photocurrent or electron-hole pairs generated in absorption region 435 are multiplied in multiplication region 437 as a result of impact ionization in accordance with the teachings of the present invention. For one embodiment, a resonant cavity is also defined in avalanche photodetector 403 between buried oxide layer 425 and the surface of avalanche photodetector 403 on which the light of illumination 417 is incident. As a result, the light illumination 417 circulates in the resonant cavity between buried oxide layer 425 and the surface of the avalanche photodetector as shown in FIG. 4A as shown.

Figure 4B:
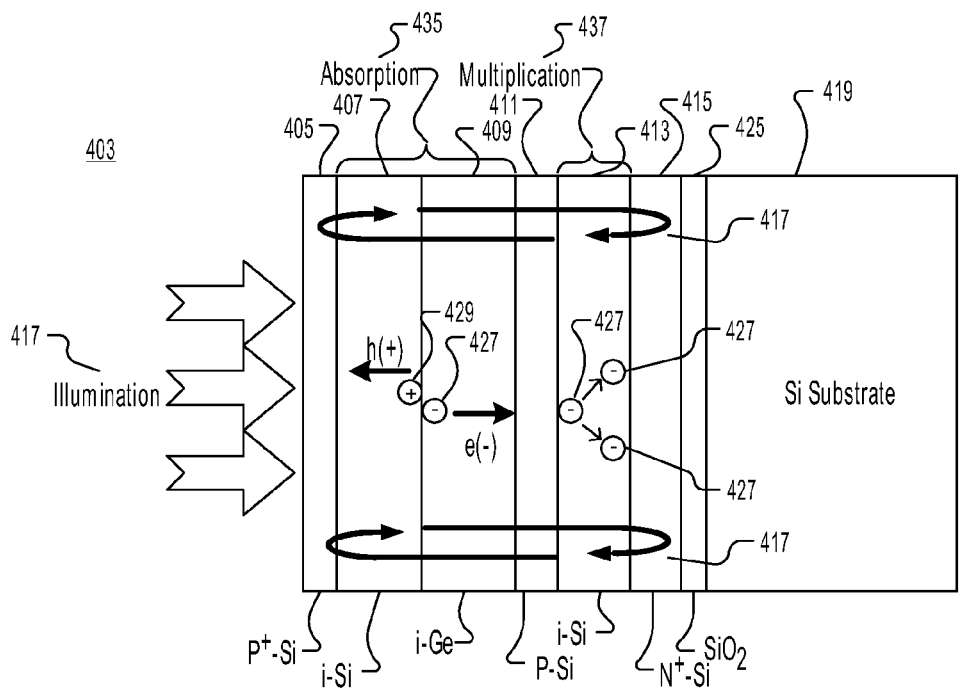
FIG. 4B is another diagram illustrating a cross-section view of a germanium/silicon avalanche photodetector with a resonant cavity that shows electron-hole pairs being generated for an embodiment of the present invention.

FIG. 4B is another diagram illustrating increased detail of a cross-section view of avalanche photodetector 403 with a resonant cavity that shows electron-hole pairs being generated for an embodiment of the present invention. In particular, FIG. 4B shows illumination 417 incident on the surface of layer 405 of avalanche photodetector 403. As illumination propagates through layers 407 and 409 of the absorption region 435, the light is absorbed, which generates photocurrent or electron-hole pairs including electron 427 and hole 429. With the electric field between p+doped layer 405 and n+doped layer 415, electrons 427 drift from absorption region 435 into multiplication region 437. With the high electric field present in layer 413 of multiplication region 437, impact ionization occurs with the electrons 427, which generates additional electron-hole pairs and therefore results in the multiplication or amplification of the photocurrent generated in absorption region 435. The holes 429 and electrons 427 are then collected by contacts that are coupled to layers 405 and 415 for an embodiment of the present invention.

As further illustrated, light from illumination 417 that is not absorbed in the first pass through avalanche photodetector 403 is reflected from buried oxide layer 425, illustrated as $SiO_2$ in FIG. 4B, and is recirculated back and forth through avalanche photodetector 403 as shown. As a result, the light from illumination 417 is recycled within the absorption region 435 and multiplication region 437, thereby increasing the probability of absorption of illumination 417 and improving the performance of avalanche photodetector 403 in accordance with the teachings of the present invention.

The above description of illustrated embodiments of the invention, including what is described in the Abstract, is not intended to be exhaustive or to be limitation to the precise forms disclosed. While specific embodiments of, and examples for, the invention are described herein for illustrative purposes, various equivalent refinements and modifications are possible, as those skilled in the relevant art will recognize. Indeed, it is appreciated that the specific wavelengths, dimensions, materials, times, voltages, power range values, etc., are provided for explanation purposes and that other values may also be employed in other embodiments in accordance with the teachings of the present invention.

These modifications can be made to embodiments of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. An apparatus, comprising:
    an absorption region including a first semiconductor material layer of intrinsic silicon proximate to a second semiconductor material layer of intrinsic germanium, wherein at least a portion of a surface of the absorption region absorbs illumination incident upon the surface;
    a multiplication region including a third semiconductor material layer of intrinsic silicon, the multiplication region including an electric field to multiply electrons created in the absorption region; and
    a spatial separation disposed between the absorption region and the multiplication region, the spatial separation provided by a p type silicon layer,
    wherein the first semiconductor material layer of intrinsic silicon directly contacts the second semiconductor material layer of intrinsic germanium, which directly contacts the p type silicon layer of the spatial separation, which directly contacts the third semiconductor material layer of intrinsic silicon.

2. The apparatus of claim 1 further comprising a buried oxide layer disposed below the third semiconductor material layer of intrinsic silicon.

3. The apparatus of claim 1 further comprising a silicon substrate layer disposed below the buried oxide layer.

* * * * *